(12) United States Patent
Miyanami

(10) Patent No.: US 8,558,340 B2
(45) Date of Patent: Oct. 15, 2013

(54) SEMICONDUCTOR DEVICE, SOLID-STATE IMAGING DEVICE, METHOD FOR MANUFACTURING SEMICONDUCTOR DEVICE, METHOD FOR MANUFACTURING SOLID-STATE IMAGING DEVICE, AND ELECTRONIC APPARATUS

(75) Inventor: Yuki Miyanami, Kanagawa (JP)

(73) Assignee: Sony Corporation, Tokyo (JP)

( * ) Notice: Subject to any disclaimer, the term of this patent is extended or adjusted under 35 U.S.C. 154(b) by 145 days.

(21) Appl. No.: 13/067,656

(22) Filed: Jun. 17, 2011

(65) Prior Publication Data

US 2012/0018617 A1    Jan. 26, 2012

(30) Foreign Application Priority Data

Jul. 21, 2010  (JP) ................................. 2010-164125

(51) Int. Cl.
 *H01L 27/146*    (2006.01)
(52) U.S. Cl.
 USPC ................... 257/446; 257/291; 257/E31.001; 438/404

(58) Field of Classification Search
 USPC ......... 257/291, 292, 431, 432, 443, 444, 446, 257/447, 460, 461, 506, 509, 544, 550, 257/E29.018, E21.54, E31.001; 438/59, 438/404; 250/208.1
 See application file for complete search history.

(56) References Cited

U.S. PATENT DOCUMENTS

2006/0273359 A1* 12/2006 Mori ............................. 257/291
2008/0042211 A1*  2/2008 Bhattacharyya et al. ..... 257/369

FOREIGN PATENT DOCUMENTS

JP          2003-318122        11/2003

* cited by examiner

*Primary Examiner* — Tucker Wright
(74) *Attorney, Agent, or Firm* — Rader, Fishman & Grauer PLLC

(57) ABSTRACT

Disclosed herein is a semiconductor device including an element isolation region configured to be formed on a semiconductor substrate, wherein the element isolation region is formed of a multistep trench in which trenches having different diameters are stacked and diameter of an opening part of the lower trench is smaller than diameter of a bottom of the upper trench.

8 Claims, 11 Drawing Sheets

SEMICONDUCTOR DEVICE, SOLID-STATE IMAGING DEVICE, METHOD FOR MANUFACTURING SEMICONDUCTOR DEVICE, METHOD FOR MANUFACTURING SOLID-STATE IMAGING DEVICE, AND ELECTRONIC APPARATUS

BACKGROUND

The present disclosure relates to a semiconductor device, a solid-state imaging device, a method for manufacturing a semiconductor device, a method for manufacturing a solid-state imaging device, and electronic apparatus.

A solid-state imaging device of a CMOS (Complementary Metal Oxide Semiconductor) image sensor (CIS) mounted type is configured by forming a unit pixel made with a photodiode serving as a light receiving part and plural transistors on a semiconductor substrate and two-dimensionally arranging the unit pixels. The plural transistors include e.g. a charge transfer transistor (TRG), an amplification transistor (AMP), a reset transistor (RST), and a selection transistor (SEL). It is also possible to employ a configuration in which these transistors are shared by plural light receiving parts. The respective terminals of these plural transistors are connected by multilayer interconnects in order to apply desired voltage pulses to these transistors and read out a signal current.

In the case of a back-illuminated imaging device, light receiving parts, transistors, and interconnect layers are formed in multiple layers on a semiconductor substrate. Thereafter, the front surface side, in which the interconnect layers are formed, is bonded to a support substrate and the semiconductor substrate is polished from the back surface to a desired thickness. The back surface side is used as the light incident surface side. In this case, color filters and on-chip lenses are formed over the polished back surface to thereby form a configuration in which light is incident on the light receiving parts from this back surface side without passing through the interconnect layers. This increases the aperture ratio and realizes an imaging device having high sensitivity.

Examples of documents relating to the related art include Japanese Patent Laid-open No. 2003-318122 (hereinafter, Patent Document 1).

SUMMARY

In the above-described back-illuminated solid-state imaging device, light is incident from the back surface side of the semiconductor substrate and thus photoelectric conversion occurs most frequently on the back surface side. Therefore, it is important to suppress color crosstalk due to leakage of electrons arising from photoelectric conversion into adjacent pixels in the vicinity of the back surface.

To suppress this electron leakage, it is preferable to surely establish element isolation. However, in the case of an element isolation region formed by impurity implantation and annealing, the impurity spreads in the lateral direction to a larger extent at a deeper position due to scattering of the impurity implanted with high energy. In the above-described back-illuminated solid-state imaging device, element isolation regions are formed by impurity implantation from the front surface side of a semiconductor substrate before interconnect layers are formed on the semiconductor substrate. Thus, the impurity spreads in the lateral direction near the substrate back surface, so that an electric field in the lateral direction near the substrate back surface is weakened. In particular, if the area of the light receiving part is set very small and the size of the light receiving part (pixel size) is about 1.2 µm or smaller, a problem that it becomes difficult to suppress crosstalk of electrons arising from photoelectric conversion into adjacent pixels occurs. In the case of forming a solid-state imaging device in which the pixel size is about 1.2 µm or smaller, it is required that the element isolation region has a width in the range of about 100 nm to 300 nm in the area with a depth equal to or larger than 1.5 µm.

So, it will be possible to form element isolation regions by implanting an impurity from the back surface side of a semiconductor substrate. However, in this case, it is necessary to prevent the interconnect layers that have been already formed on the front surface side from being damaged. Therefore, studies are being made on a method in which only a shallow area of the substrate back surface is activated by e.g. laser annealing. However, it is difficult to achieve both of suppression of thermal diffusion of the impurity and recovery of crystal defects due to the impurity implantation.

Furthermore, it will also be possible to employ a method in which leakage of a charge into adjacent pixels is suppressed by forming trenches around the back surface of a semiconductor substrate to thereby physically isolate the pixels. However, also in this case, the interconnect layers that have been already formed on the front surface side are affected and thus limitation that heating beyond a certain degree of temperature is difficult arises. This leads to a problem that it is difficult to make pinning in the trench by e.g. a p-type impurity and recover defects by e.g. annealing in order to suppress factors in the occurrence of white dot and dark current due to the trench processing.

Furthermore, this applies also to a semiconductor device including a normal MOS transistor and so forth. Specifically, there has not been established a technique to easily and surely form an element isolation region that is free from spread in the lateral direction due to e.g. impurity diffusion and has a narrow width in a comparatively-deep area by forming from a surface of a semiconductor substrate.

There is a need for a technique to suppress the spread of an element isolation region provided in a semiconductor device and a solid-state imaging device in the lateral direction in a deep area.

According to an embodiment of the present disclosure, there is provided a semiconductor device including an element isolation region formed of a trench on a semiconductor substrate. This element isolation region is formed of a multi-step trench in which trenches having different diameters are stacked and the diameter of an opening part of the lower trench is smaller than the diameter of the bottom of the upper trench.

According to another embodiment of the present disclosure, there is provided a method for manufacturing a semiconductor device. The method includes forming a first trench in a semiconductor substrate, and forming an oxide film on an inner wall of the first trench. Furthermore, the method includes forming a second trench by etching the bottom of the first trench with use of the oxide film formed on the inner wall of the first trench as a mask, and forming an element isolation layer inside the second trench. In addition, the method includes epitaxially growing an element isolation layer inside the first trench.

According to another embodiment of the present disclosure, there is provided a solid-state imaging device including: unit pixels configured to be two-dimensionally arranged and be each composed of a light receiving part and at least one transistor to convert a charge obtained by photoelectric conversion in the light receiving part to a signal; and an element isolation region configured to isolate the unit pixel and have a trench structure. The element isolation region is formed of a multistep trench in which trenches having different diameters are stacked and the diameter of an opening part of the lower trench is smaller than the diameter of the bottom of the upper trench.

According to another embodiment of the present disclosure, there is provided a method for manufacturing a solid-state imaging device. The method includes forming element isolation regions having a trench structure on a semiconductor substrate, forming a light receiving part between the element isolation regions, and forming a transistor connected to the light receiving part. The forming element isolation regions includes forming a first trench in the semiconductor substrate, and forming an oxide film on an inner wall of the first trench. Furthermore, the forming element isolation regions includes forming a second trench by etching the bottom of the first trench with use of the oxide film formed on the inner wall of the first trench as a mask. In addition, the forming element isolation regions includes epitaxially growing a semiconductor layer inside the second trench, removing the oxide film left on a side surface of the inner wall of the first trench, and epitaxially growing a semiconductor layer inside the first trench.

According to another embodiment of the present disclosure, there is provided electronic apparatus including the semiconductor device or the solid-state imaging device having the above-described configuration of one embodiment of the present disclosure.

As described above, the semiconductor device and the solid-state imaging device according to embodiments of the present disclosure have a configuration in which its element isolation region is formed of a multistep trench in which trenches having different diameters are stacked and the diameter of an opening part of the lower trench is smaller than that of the bottom of the upper trench.

The "diameter" of the trench is equivalent to the "width" of the trench in an arbitrary section irrespective of the planar shape of the trench. That is, the above-described configuration means a configuration in which the width of the opening end of the lower trench is smaller than that of the bottom of the upper trench in any section.

The trench having such a configuration can be formed easily and surely by utilizing the method for manufacturing a semiconductor device or the method for manufacturing a solid-state imaging device according to the above-described embodiment of the present disclosure. Specifically, in these manufacturing methods, an oxide film is formed on the inner wall and bottom of the first trench having a comparatively-large diameter and the second trench is formed by anisotropic etching with use of this oxide film as a mask. Thus, the opening end of the second trench is surely formed inside the bottom of the first trench. Due to this feature, the multistep trench can be formed easily and surely in such a manner that the diameter of the opening part of the second trench is set smaller than that of the bottom of the first trench. That is, it is possible to surely form the element isolation region having a width narrowed in the depth direction.

Therefore, in the case of using this element isolation region for a back-illuminated solid-state imaging device, even when the element isolation region is formed before interconnect layers are formed, the width of the element isolation region on the light incident side is small and the impurity does not spread in the lateral direction. Simultaneously, the trench processing is performed before the interconnect layers are formed, and factors in the occurrence of white dot and dark current can be suppressed through pinning in the trench by e.g. a p-type impurity and recovery of defects by e.g. annealing, so that the occurrence of white dot and dark current can be suppressed. Furthermore, also in the case of application to various kinds of semiconductor devices including a transistor and so forth, change in the width of the element isolation region in the depth direction can be controlled with high accuracy and thus the size of the element isolation region can be adjusted with high controllability in accordance with various purposes.

The embodiments of the present disclosure can surely suppress the spread of an element isolation region provided in a semiconductor device or a solid-state imaging device in the lateral direction in a deep area.

DETAILED DESCRIPTION OF THE PREFERRED EMBODIMENTS

Examples of the best mode for carrying out the present disclosure (hereinafter, referred to as embodiment) will be described below with reference to the drawings. The order of the description is as follows.
1. First Embodiment (embodiment of semiconductor device and method for manufacturing semiconductor device)
(1) Embodiment of Semiconductor Device (embodiment of MOS transistor)

(2) Embodiment of Method for Manufacturing Semiconductor Device (embodiment of method for manufacturing MOS transistor)

2. Second Embodiment (embodiment of solid-state imaging device and method for manufacturing solid-state imaging device)

(1) Embodiment of Solid-state Imaging Device (example of CIS back-illuminated solid-state imaging device)

(2) Embodiment of Method for Manufacturing Solid-state Imaging Device (embodiment of method for manufacturing CIS back-illuminated solid-state imaging device)

(3) Modification Examples of Embodiment of Solid-state Imaging Device (4) Another Embodiment of Solid-state Imaging Device (embodiment of CIS front-illuminated solid-state imaging device)

3. Third Embodiment (embodiment of electronic apparatus)

1. First Embodiment

Embodiment of Semiconductor Device and Method for Manufacturing Semiconductor Device (1) Embodiment of Semiconductor Device (Embodiment of MOS Transistor)

Figure 1:
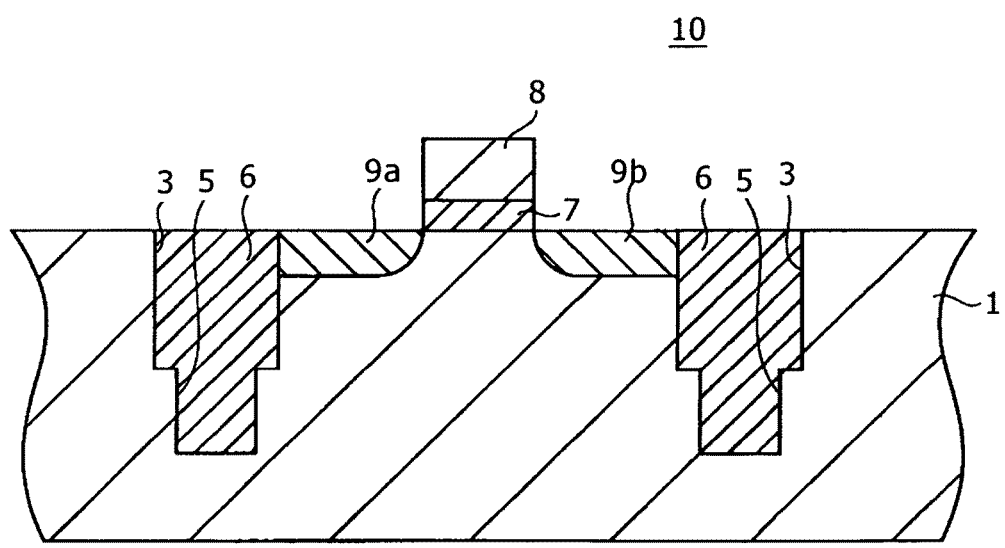
FIG. 1 is a schematic sectional view of the configuration of a semiconductor device according to an embodiment of the present disclosure.

FIG. 1 is a schematic sectional view of the configuration of the major part of a semiconductor device according to a first embodiment. As shown in FIG. 1, this semiconductor device 10 is an example of a device that has element isolation regions 6 having a multistep trench structure on a semiconductor substrate 1 of e.g. Si and has a MOS transistor between the element isolation regions 6. This transistor is made by forming a gate electrode 8 on a gate insulating layer 7 formed of e.g. an oxide film and forming source/drain regions 9a and 9b on both sides of the gate electrode 8. The element isolation region 6 is formed by stacking a first trench 3 and a second trench 5 having different diameters. Furthermore, it is formed of a multistep trench having a configuration in which the diameter of the opening part of the second trench 5 as the lower trench is smaller than that of the bottom of the first trench 3 as the upper trench. In addition, e.g. an impurity-containing semiconductor layer is formed inside the first trench 3 and the second trench 5, so that the element isolation region 6 is configured. The "diameter" of the first trench 3 and the second trench 5 refers to the width in a section along the direction traversing the gate electrode 8 in FIG. 1, and furthermore refers also to the widths in other sections. That is, the element isolation region 6 is so configured that the width of the lower trench is smaller than that of the upper trench in an arbitrary section similarly. The planar shape and size of the element isolation region 6 are not particularly limited.

In the semiconductor device 10 having the element isolation region 6 with such a configuration, the spread of the element isolation region 6 in the lateral direction in a deep area can be suppressed compared with the semiconductor device having the related-art configuration, in which the element isolation region is formed by ion implantation. Thus, by applying this element isolation region 6 to e.g. a high breakdown voltage MOS transistor described in the above-mentioned Patent Document 1, a high breakdown voltage MOS transistor having the element isolation region with little spread of an impurity in the lateral direction in the region to a deep area can be provided. Furthermore, it is obvious that an embodiment of the present disclosure can be applied to various semiconductor devices having an element isolation region, such as various kinds of transistors other than the MOS transistor, memory elements, and capacitors.

Depending on the kind and use purpose of the semiconductor device, an impurity-containing semiconductor layer may be formed in the lower trench having the comparatively-small diameter by selective epitaxial growth, and an oxide film may be so formed as to be buried in the upper trench having the comparatively-large diameter. Also when such a configuration is employed, the spread of the impurity diffusion layer in the lateral direction in a deep area can be surely suppressed. This makes it possible to form the element isolation region as designed in the case of forming a transistor having a small size.

(2) Embodiment of Method for Manufacturing Semiconductor Device (Embodiment of Method for Manufacturing MOS Transistor)

Figure 2A:
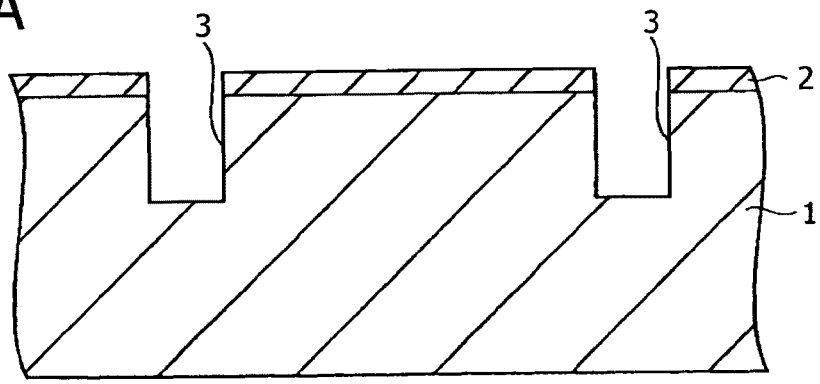
FIGS. 2A to 2F are step diagrams showing a method for manufacturing a semiconductor device according to a first embodiment of the present disclosure.

One example of a method for manufacturing a semiconductor device according to the first embodiment of the present disclosure will be described below with reference to FIGS. 2A to 2F. In this example, a two-step trench is formed and an impurity-containing semiconductor layer is buried in the upper and lower trenches by epitaxial growth. First, as shown in FIG. 2A, an oxide film 2 is formed by e.g. thermal oxidation or CVD on the semiconductor substrate 1 of e.g. Si, a compound semiconductor, or SOI (Silicon on Insulator) obtained by forming a semiconductor layer on an insulating substrate. Thereafter, the first trench 3 having a predetermined diameter is formed by using photolithography and so forth. The etching treatment for the first trench 3 can be performed in single-wafer dry etching apparatus under the following conditions for example.

Figure 2B:
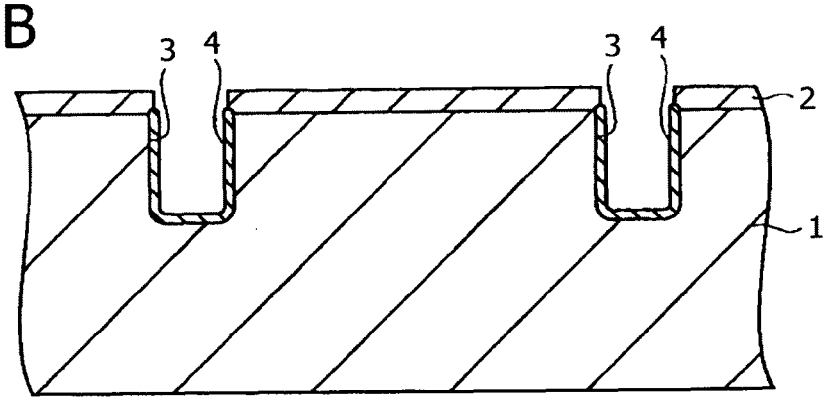

Pressure: 50 to 150 mTorr
RF power: 500 to 900 W
Etching gas: HBr, $NF_3$, $O_2$
HBr flow rate: 100 to 300 sccm
$NF_3$ flow rate: 5 to 15 sccm
$O_2$ flow rate: 0 to 5 sccm Next, as shown in FIG. 2B, an oxide film 4 is formed by e.g. thermal oxidation or CV (Chemical Vapor Depositon) on the inner wall of the first trench 3. If the oxide film 4 is formed by CVD, it is formed on the surface of the inner wall of the first trench 3. If it is formed by thermal oxidation, it is so formed as to erode the inside of the inner wall of the first trench 3. In FIG. 2B, the case in which it is formed by thermal oxidation is exemplified. The thickness of this oxide film 4 corresponds to the difference between the diameter of the first trench 3 and the diameter of the second trench to be described later, and therefore it is preferable to accordingly select the thickness depending on the shape, kind, size, and so forth of the intended element isolation region. The thickness of the oxide film 4 can be adjusted with high accuracy by control of the oxidation treatment time.

Figure 2C:
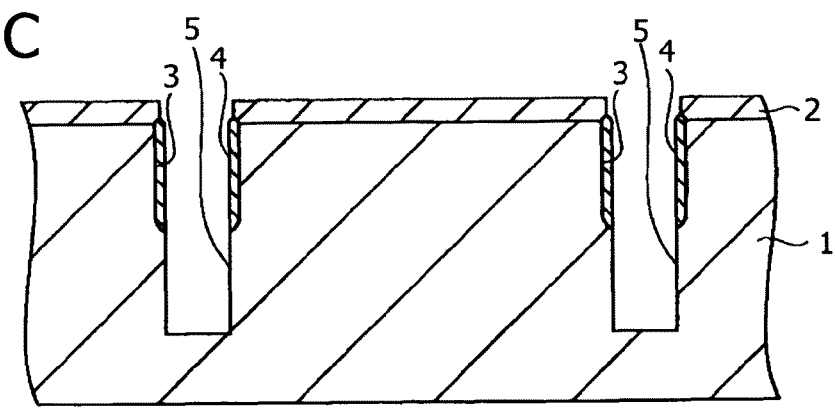

Thereafter, as shown in FIG. 2C, the second trench 5 is formed by additionally performing anisotropic dry etching. As described above, the diameter of this second trench 5 is smaller than that of the first trench 3 by the film thickness of the oxide film 4 formed on the inner wall of the first trench 3.

Figure 2D:
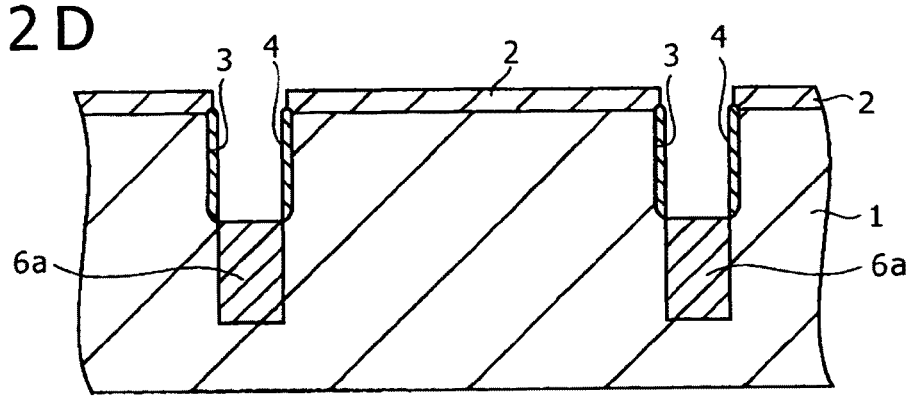

In this state, as shown in FIG. 2D, an element isolation layer 6a composed of e.g. an impurity-containing semiconductor is formed inside the second trench 5 by selective epitaxial growth, to backfill the second trench 5. As this element isolation layer 6a, e.g. B (boron)-doped Si can be used. The epitaxial growth in this case can be performed e.g. under the following conditions.

Temperature: 750° C. to 850° C.
Pressure: 10 Torr to 760 Torr
Source gas: dichlorosilane (DCS), HCl, $H_2$, $B_2H_6$
DCS flow rate: 10 to 100 sccm
HCl flow rate: 10 to 300 sccm H₂ flow rate: 10 to 50 slm B₂H₆ (100 ppm/H₂) flow rate: 0.01 to 10 sccm In this epitaxial growth, the oxide film 4 formed on the inner wall of the first trench 3 serves as a mask in selective epitaxial growth, and thus the semiconductor layer is not formed in the first trench 3.

Figure 2E:
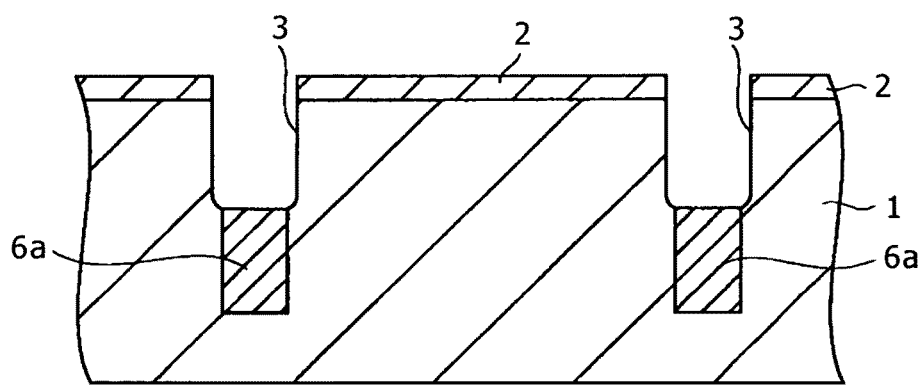

Subsequently, as shown in FIG. 2E, the oxide film 4 left on the inner wall of the first trench 3 is removed by e.g. wet etching. This wet etching treatment can be performed in batch wet etching apparatus by a diluted hydrofluoric acid (DHF) prepared at a dilution rate of 1 to 100 for example.

Figure 2F:
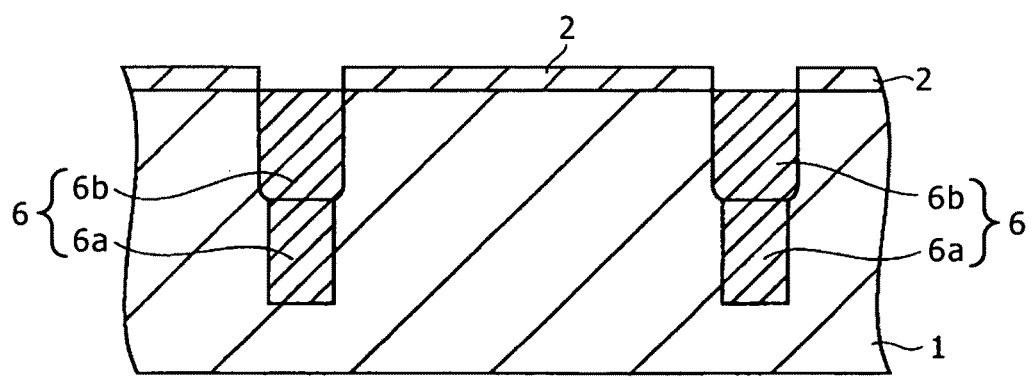

At last, as shown in FIG. 2F, treatment of forming an element isolation layer 6b inside the first trench 3 to backfill the first trench 3 is performed. As this element isolation layer 6b, e.g. an impurity-containing semiconductor layer by selective epitaxial growth can be employed and e.g. B-doped Si can be used. As the conditions of this epitaxial growth, conditions similar to the growth conditions in the backfill of the second trench 5 can be employed. Instead of performing the epitaxial growth, the element isolation layer 6b formed of an oxide film may be formed inside the first trench 3 by further performing thermal oxidation or the like without the removal of the oxide film 4 in the step shown in FIG. 2E.

Thereafter, in the area surrounded by the element isolation regions 6, the gate insulating layer 7 formed of e.g. an oxide film, the gate electrode 8, and the source/drain regions 9a and 9b on both sides of the gate electrode 8 are formed. The method for manufacturing the respective components other than the element isolation region 6, including these components, is not particularly limited and any manufacturing method can be employed.

Through the above-described manufacturing steps, the element isolation region 6 formed of the multistep trench having the first trench 3 and the second trench 5 with different diameters can be formed. In this case, the diameter of the opening part of the second trench 5 as the lower trench can be set smaller than that of the bottom of the first trench 3 as the upper trench. In addition, the opening part of the second trench 5 can be surely formed inside the bottom of the first trench 3. Furthermore, the semiconductor device 10 having the element isolation region 6 with a trench structure that is formed with suppression of the spread of the impurity in the lateral direction and has a narrow-width shape in a deep area can be formed.

2. Second Embodiment

Embodiment of Solid-State Imaging Device and Method for Manufacturing Solid-State Imaging Device (1) Embodiment of Solid-State Imaging Device (Example of CIS Back-Illuminated Solid-State Imaging Device)

Figure 3:
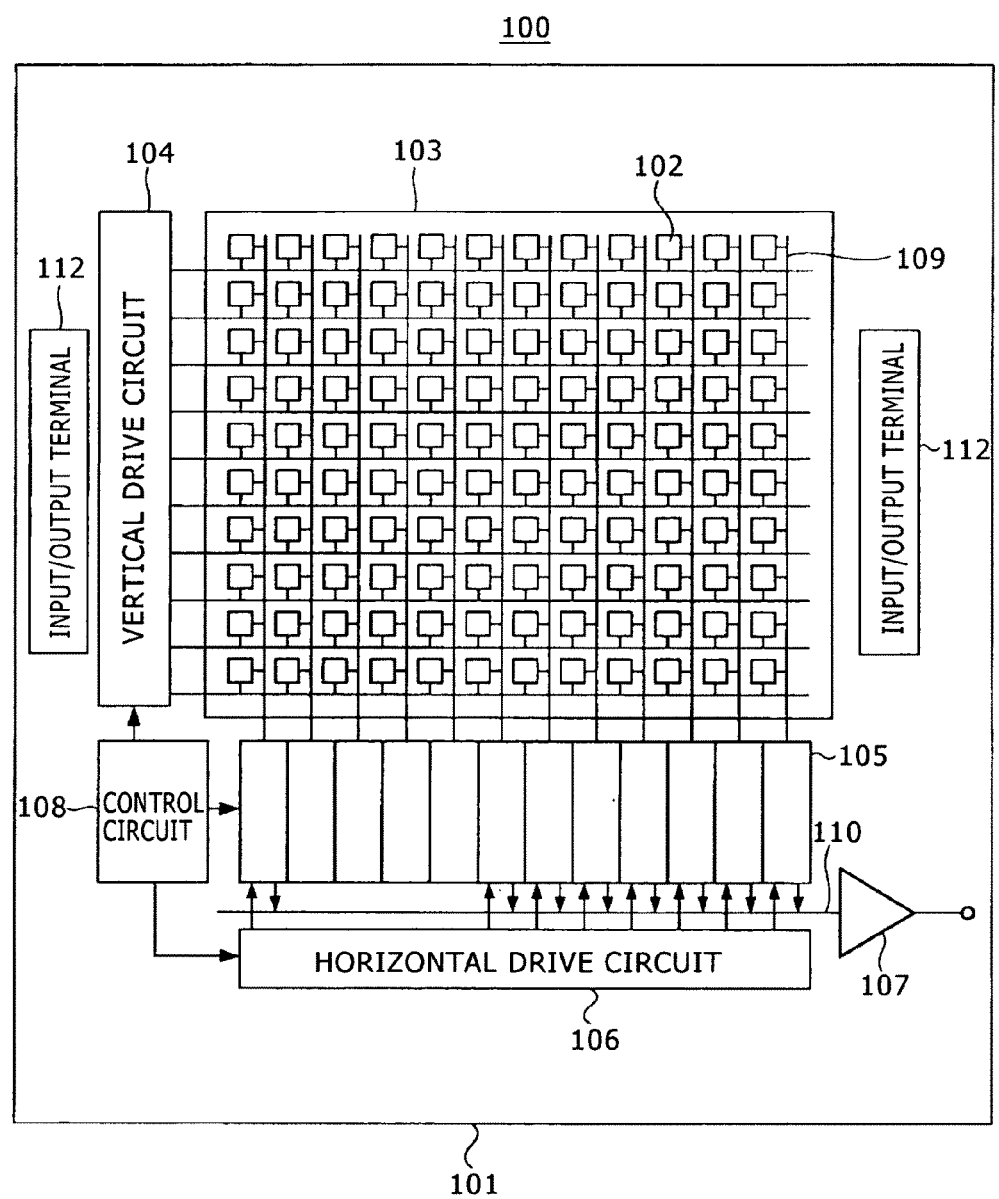
FIG. 3 is a schematic configuration diagram of a solid-state imaging device according to an embodiment of the present disclosure.

One example of a solid-state imaging device according to a second embodiment of the present disclosure will be described below with reference to FIG. 3. This is an example of a solid-state imaging device of a CIS mounted type capable of being used as an imager of electronic apparatus such as a camera, and is applied to a solid-state imaging device according to embodiment and modification examples to be described later. A solid-state imaging device 100 of the present example has a pixel array (pixel area) 103 obtained by regularly arranging pixels 102 including plural light receiving parts in a two-dimensional array manner on a substrate 101 formed of e.g. a Si substrate, and a peripheral circuit part. The pixel 102 has e.g. a photodiode serving as the light receiving part to perform photoelectric conversion and plural pixel transistors (MOS transistor). The plural pixel transistors may be composed of e.g. three transistors, i.e. a transfer transistor, a reset transistor, and an amplification transistor. Alternatively, it is also possible that a selection transistor is added and the plural pixel transistors are composed of four transistors. The equivalent circuit of the unit pixel is similar to a normal circuit and therefore detailed description thereof is omitted. The pixel 102 can be configured as one unit pixel. It is also possible that the pixel 102 has a sharing pixel structure. This pixel sharing structure is composed of plural photodiodes, plural transfer transistors, shared one floating diffusion, and each shared one of the other pixel transistors. That is, in the sharing pixel structure, the photodiodes and the transfer transistors configuring the plural unit pixels share each one of the other pixel transistors.

The peripheral circuit part has a vertical drive circuit 104, column signal processing circuits 105, a horizontal drive circuit 106, an output circuit 107, a control circuit 108, and so forth.

The control circuit 108 receives an input clock and data to order the operating mode and so forth, and outputs data of the internal information of the solid-state imaging device and so forth. Specifically, the control circuit 108 generates a clock signal and a control signal serving as the basis of the operation of the vertical drive circuit 104, the column signal processing circuits 105, the horizontal drive circuit 106, and so forth based on a vertical synchronizing signal, a horizontal synchronizing signal, and a master clock. Furthermore, the control circuit 108 inputs these signals to the vertical drive circuit 104, the column signal processing circuits 105, the horizontal drive circuit 106, and so forth.

The vertical drive circuit 104 is configured with e.g. a shift register. It selects a pixel drive line and supplies a pulse for driving the pixels to the selected pixel drive line, to drive the pixels on a row-by-row basis. Specifically, the vertical drive circuit 104 selectively scans the respective pixels 102 of the pixel array 103 on a row-by-row basis in the vertical direction sequentially and supplies a pixel signal based on a signal charge generated depending on the amount of received light in the light receiving part of each pixel 102 to the column signal processing circuit 105 via a vertical signal line 109.

The column signal processing circuit 105 is disposed for each column of the pixels 102 for example and executes signal processing such as denoising for the signal output from the pixels 102 on one row on each pixel column basis. Specifically, the column signal processing circuit 105 executes signal processing such as CDS for removing fixed pattern noise specific to the pixel 102, signal amplification, and AD conversion. At the output stage of the column signal processing circuit 105, a horizontal selection switch (not shown) is provided and connected between the column signal processing circuit 105 and a horizontal signal line 110.

The horizontal drive circuit 106 is configured with e.g. a shift register. It sequentially outputs a horizontal scanning pulse to thereby select each of the column signal processing circuits 105 in turn and make the pixel signal be output from each of the column signal processing circuits 105 to the horizontal signal line 110.

The output circuit 107 executes signal processing for the signal sequentially supplied from each of the column signal processing circuits 105 via the horizontal signal line 110 and outputs the resulting signal. For example, the output circuit 107 performs only buffering in some cases, and executes black level adjustment, column variation correction, various kinds of digital signal processing, and so forth in other cases. An input/output terminal 112 exchanges a signal with the external.

Figure 4:
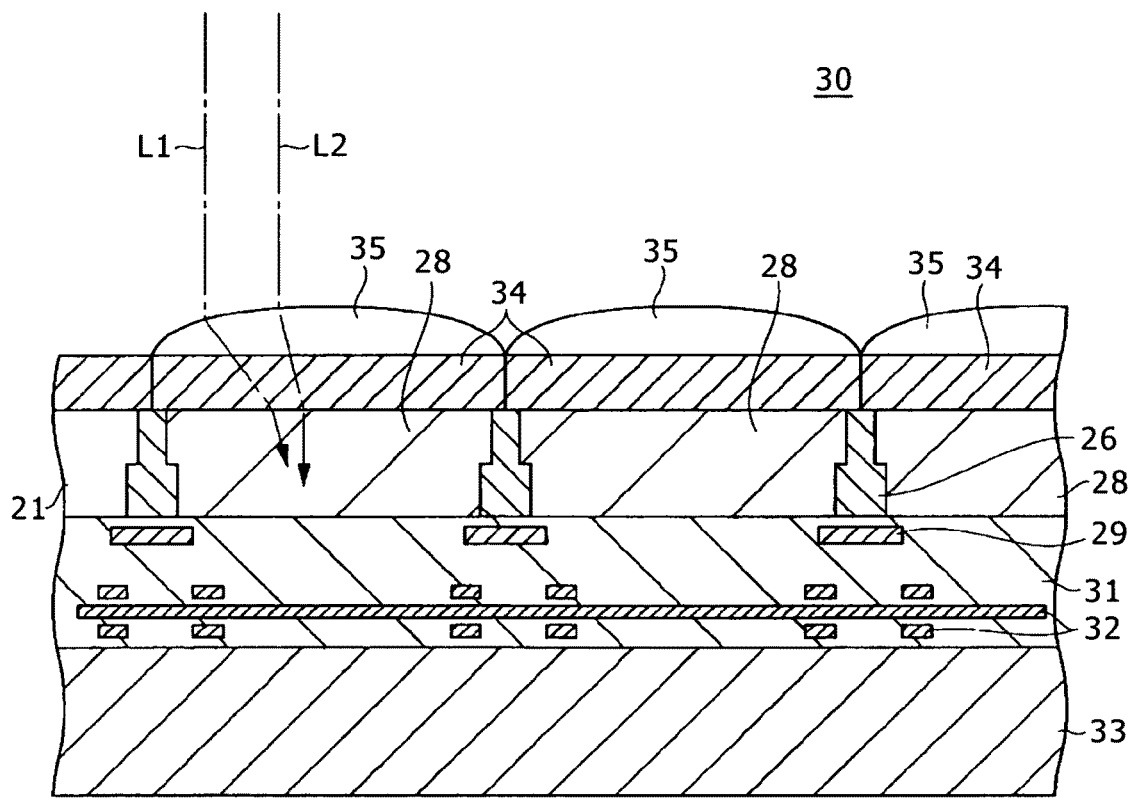
FIG. 4 is a schematic sectional view of the configuration of the major part of the solid-state imaging device according to the embodiment of the present disclosure.

In the solid-state imaging device 100 according to the present embodiment, an element isolation region is provided in the substrate 101 of the above-described pixels 102. This element isolation region has a configuration in which trenches having different diameters are stacked and the diameter of the opening part of the lower trench is smaller than that of the bottom of the upper trench. FIG. 4 shows application to a back-illuminated CIS solid-state imaging device and is a schematic sectional view showing a configuration including plural pixels.

As shown in FIG. 4, in this back-illuminated solid-state imaging device 30, light receiving parts 28 formed of e.g. PDs (photodiodes) corresponding to red, green, and blue are formed in a substrate 21 of e.g. Si. Gate electrodes 29 of pixel transistors are formed on one surface (front surface) of the substrate 21. Interconnect layers 32 are formed over the gate electrodes 29 with the intermediary of an insulating layer 31 and a support substrate 33 is bonded over the interconnect layers 32. Over the other surface (back surface) of the substrate 21, color filters 34 corresponding to e.g. red, green, and blue and on-chip lenses 35 at the positions corresponding to the color filters 34 are formed. One-dot chain lines L1 and L2 in FIG. 4 schematically show how light travels toward the light receiving part 28 through the on-chip lens 35 and the color filter 34. In this example, element isolation regions 26 for the light receiving parts 28 are each formed of a multistep trench in which two trenches having different diameters are stacked and the diameter of the opening part of the lower trench is smaller than that of the bottom of the upper trench.

According to the solid-state imaging device 30 provided with the element isolation region 26 formed of a trench with such a configuration, the width of the isolation region can be narrowed in a deep area around the back surface in contrast to the related art in which the element isolation region by high-energy ion implantation is provided. In the above-described example, the back-illuminated configuration in which the back surface is used as the light incident surface is formed, and an electric field near the back surface can be intensified, which can suppress color crosstalk. Furthermore, the capacitance of the light receiving part 28 formed of a PD can be increased particularly in the vicinity of the light incident surface of the light receiving part 28 in the blue region. This can increase the amount of saturated signal of blue and thus can improve the dynamic range.

(2) Embodiment of Method for Manufacturing Solid-State Imaging Device (Embodiment of Method for Manufacturing CIS Back-Illuminated Solid-State Imaging Device)

Figure 5A:
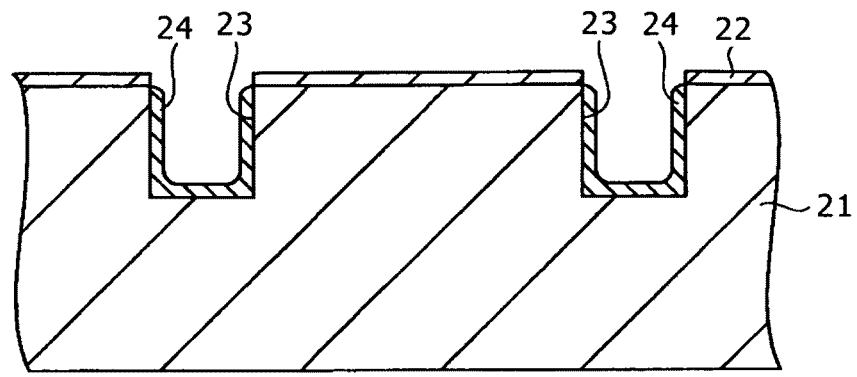
FIGS. 5A to 5C are step diagrams showing a method for manufacturing a solid-state imaging device according to an embodiment of the present disclosure.
Figure 5B:
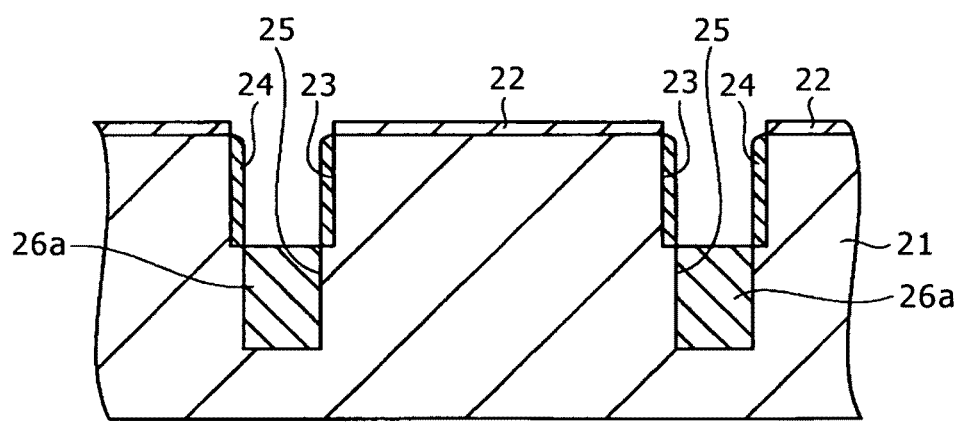
Figure 5C:
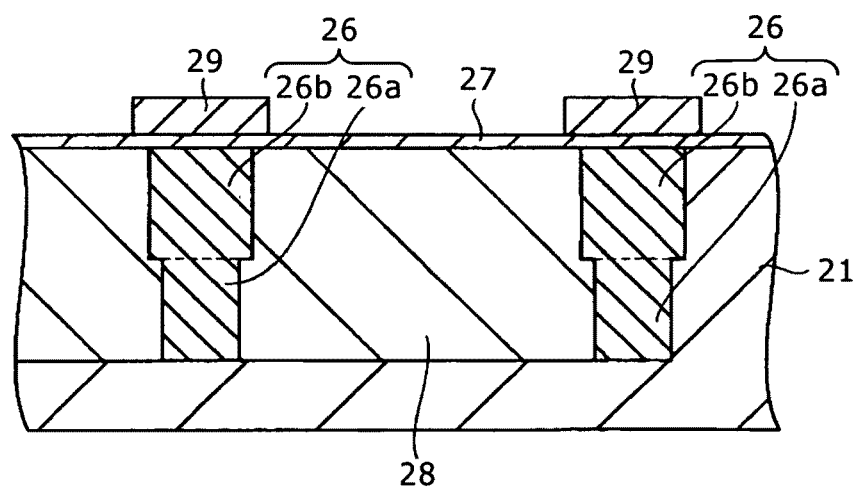

With reference to FIGS. 5A to 5C, a description will be made below about one example of a method for manufacturing a solid-state imaging device, suitable to be applied to the manufacturing process of the solid-state imaging device 30 shown in FIG. 4. In this example, first, as shown in FIG. 5A, an oxide film 22 is formed by e.g. thermal oxidation on a surface of the substrate 21 of e.g. Si. Subsequently, in the area to isolate the light receiving part formed in a later step, a first trench 23 having a depth shallower than that of e.g. the Si active layer (not shown) is formed. For the forming of the first trench 23, etching treatment can be performed in single-wafer dry etching apparatus under the following conditions for example.

Pressure: 50 to 150 mTorr
RF power: 500 to 900 W
Etching gas: $HBr/NF_3/O_2$
HBr flow rate: 100 to 300 sccm
$NF_3$ flow rate: 0.5 to 15 sccm
$O_2$ flow rate: 0 to 5 sccm At this time, the oxide film 22 on the substrate 21 and an oxide film 24 on the inner wall of the first trench 23 serve as a mask in the etching. Therefore, by adjusting the film thickness of the oxide film 24 and the etching conditions, the diameter of the opening part of a second trench 25 can be adjusted with high accuracy.

Next, the oxide film 24 is formed on the inner wall of the first trench 23 by e.g. thermal oxidation or CVD. In the example of FIGS. 5A to 5C, the oxide film 24 is formed by CVD and the oxide film 24 is deposited only on the surface side from the inner wall of the first trench 23 (toward the internal side of the trench). Also in this case, it is also possible to form the oxide film 24 by thermal oxidation. Similarly to the first embodiment, it is preferable to accordingly select its film thickness depending on the intended diameter of the opening part of the lower trench to be described later and adjust the film deposition conditions. Thereafter, as shown in FIG. 5B, the second trench 25 is formed e.g. by performing anisotropic dry etching under the etching conditions similar to those of the above-described first trench 23. As a result of this step, the diameter of the opening part of the second trench 25 is smaller than that of the bottom of the first trench 23 by the film thickness of the oxide film 24 on the inner wall of the first trench 23, and the opening part of the second trench 25 is formed inside the bottom of the first trench 23. In this state, an element isolation layer 26a composed of e.g. B-doped Si is formed inside the second trench 25 by e.g. selective epitaxial growth, to backfill the inside of the second trench 25. It is preferable that this element isolation layer 26a be a semiconductor layer of the conductivity type opposite to that of the light receiving part formed in a later step. The epitaxial growth of B-doped Si can be performed e.g. under the following conditions.

Temperature: 750° C. to 850° C.
Pressure: 10 Torr to 760 Torr
Source gas: DCS, HCl, $H_2$, $B_2H_6$
DCS flow rate: 10 to 100 sccm
HCl flow rate: 10 to 300 sccm
$H_2$ flow rate: 10 to 50 slm
$B_2H_6$ (100 ppm/$H_2$) flow rate: 0.01 to 10 sccm In this step, the oxide film 24 formed on the inner wall of the first trench 23 serves as a mask in the selective epitaxial growth. Subsequently, as shown in FIG. 5C, the oxide film 24 on the inner wall of the first trench 23 is removed by e.g. wet etching. This wet etching can be performed in batch wet etching apparatus by a DHF prepared at a dilution rate of 1 to 100 for example. At last, an element isolation layer 26b of e.g. B-doped Si is formed inside the first trench 23 by e.g. selective epitaxial growth, to backfill the inside of the first trench 23.

Through the above-described steps, the element isolation region 26 formed of a multistep trench, i.e. a two-step trench in this case, having the first trench 23 and the second trench 25 with different diameters can be formed. In this case, the diameter of the opening part of the second trench 25 as the lower trench can be set smaller than that of the bottom of the first trench 23 as the upper trench. In addition, the opening part of the second trench 25 can be surely formed inside the bottom of the first trench 23. Furthermore, the element isolation region 26 formed of a trench that is free from the spread of the impurity in the lateral direction and has a narrow-width shape in a deep area can be formed.

Thereafter, in the area isolated by the element isolation region 26, the light receiving part 28 form of e.g. a photodiode and plural pixel transistors including a gate insulating layer 27 by e.g. thermal oxidation, gate electrodes 29, and so forth are formed by using a process similar to that of the related art. In addition, a peripheral circuit is formed although not shown in the diagram.

Figure 6:
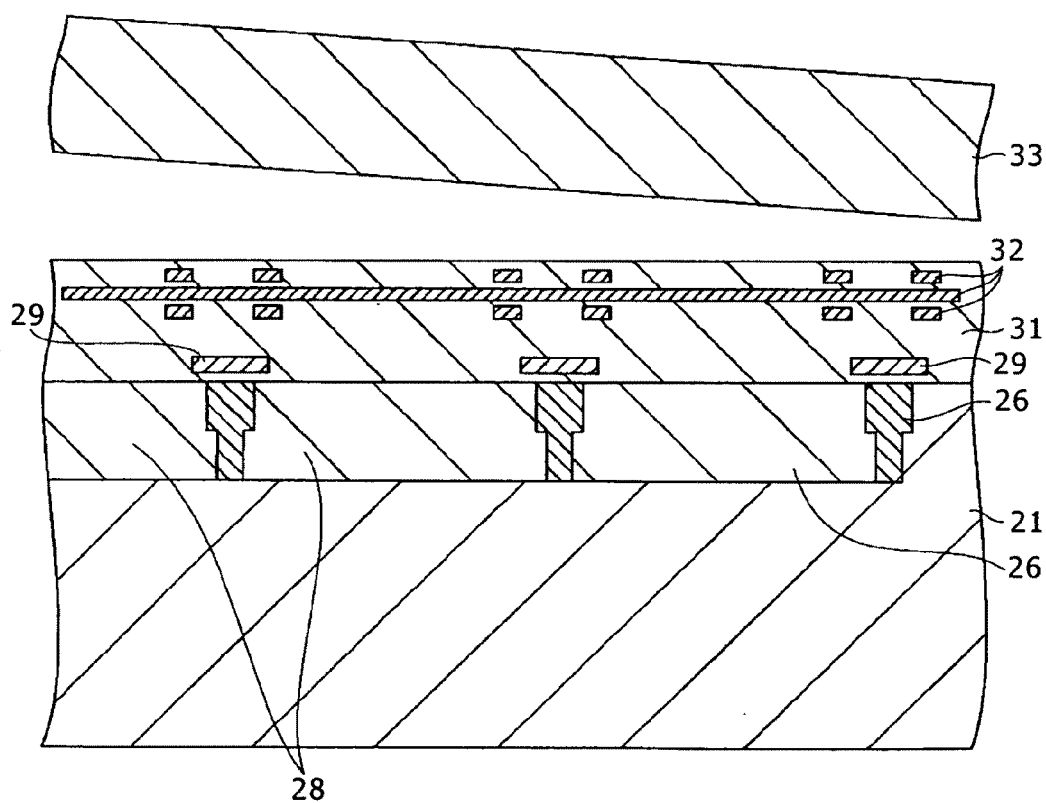
FIG. 6 is a step diagram showing the method for manufacturing a solid-state imaging device according to the embodiment of the present disclosure.

Subsequently, as shown in FIG. 6, the multiple interconnect layers 32 are formed with the intermediary of the insulating layer 31 and the support substrate 33 is bonded onto a planarizing layer on the interconnect layers 32. Moreover, the substrate 21 of e.g. Si is polished from the back surface side to obtain a desired film thickness although not shown in the diagram. Subsequently, the color filters and the on-chip lenses are formed on the polished surface, so that the back-illuminated solid-state imaging device 30 shown in FIG. 4 can be obtained. The method for manufacturing the respective components other than the element isolation region 26 is not particularly limited and any manufacturing method can be employed. In addition, other various components such as a light-blocking film can also be added.

In the above-described manufacturing steps, the trench structure is formed in two or more steps in a divided manner. Thereafter, the steps of backfill on a trench-by-trench basis by selective epitaxial growth are carried out. In this case, the depth of the trench backfilled in one round of the epitaxial growth step is equal to or smaller than half the depth of the whole trench. Therefore, for example even if a trench having a narrow-width, deep shape, such as a trench whose aspect ratio is 10 or higher, is finally formed, the aspect ratio of the trench backfilled in one round of the epitaxial growth is set lower than 10, and thus the occurrence of voids is caused less readily. Therefore, even in the case of forming the element isolation region having a trench structure with a high aspect ratio, epitaxial growth can be performed without forming of voids.

As described above, according to the embodiment applied to the back-illuminated solid-state imaging device 30, the diameter (width in a given section) of the element isolation region 26 can be narrowed and adjusted to a desired diameter with high accuracy in a deep area around the back surface of the substrate 21, i.e. on the light incident surface (light receiving surface) side finally. In this case, for example when the pixel size is set to 1.2 μm, the width of the element isolation region 26 in the area of a depth of at most 1.5 μm from the surface of the light receiving part 28 can be set to a narrow width of about 0.2 μm or narrower. This can intensify an electric field near the back surface (light receiving surface) and thus can suppress color crosstalk. Moreover, the capacitance of the light receiving part 28 formed of a PD can be increased particularly in the region near the light receiving surface corresponding to the blue color filter 34, i.e. in the blue region. Thus, the amount of saturated signal of the blue band can be increased and thus the dynamic range can be improved.

(3) Modification Examples of Solid-State Imaging Device

In the above-described examples shown in FIG. 4 to FIG. 6, the element isolation region is formed based on a two-step trench. However, the trench structure of the element isolation region is not limited thereto. Modification examples of the solid-state imaging device having the element isolation regions based on other configurations will be described below.

(3-1) Modification Example with Three-Step Trench Structure

Figure 7A:
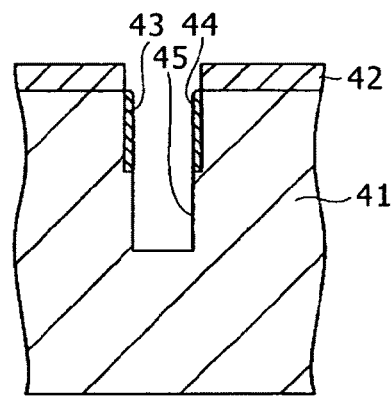
FIGS. 7A to 7D are step diagrams showing a modification example of the method for manufacturing a solid-state imaging device according to the embodiment of the present disclosure.

With reference to FIGS. 7A to 7D, an example in which an element isolation region is configured based on a three-step trench structure will be described together with one example of a method for manufacturing it. In this example, first, as shown in FIG. 7A, an oxide film 42 is formed on a substrate 41 by e.g. thermal oxidation. Subsequently, a first trench 43 is formed by using photolithography and so forth and an oxide film 44 is formed inside it by e.g. thermal oxidation or CVD. Subsequently, a second trench 45 is formed by using the oxide films 42 and 44 as a mask.

Figure 7B:
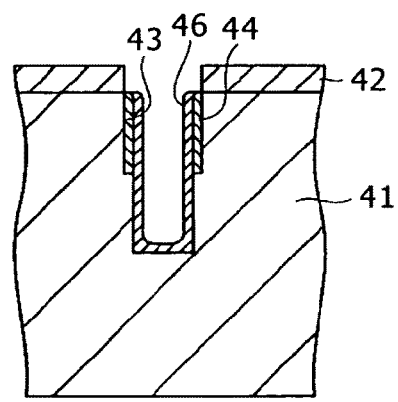
Figure 7C:
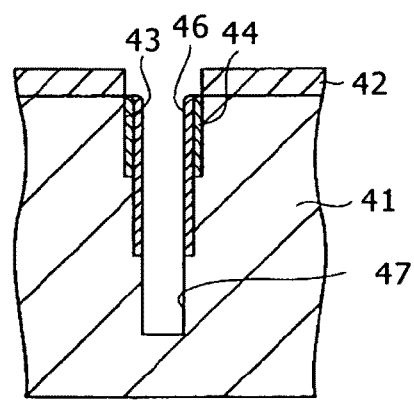
Figure 7D:
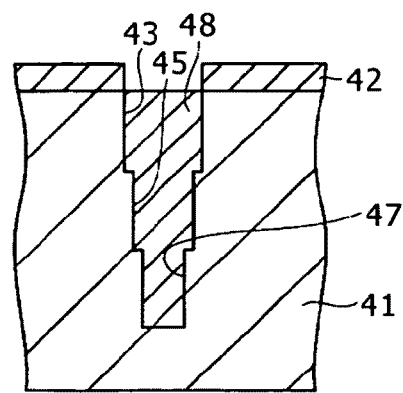

Subsequently, as shown in FIG. 7B, an oxide film 46 is further formed by e.g. thermal oxidation or CVD inside the first trench 43 and the second trench 45. Subsequently, as shown in FIG. 7C, a third trench 47 is formed under the bottom of the second trench 45 by using these oxide films 42, 44, and 46 as a mask. This third trench 47 is so formed that the diameter of the opening part of the third trench 47 is set smaller than that of the bottom of the second trench 45 similarly to the forming of the second trench 45. That is, the opening part of the second trench 45 is formed inside the bottom of the first trench 43, and the opening part of the third trench 47 is formed inside the bottom of the second trench 45.

Thereafter, first a material layer of e.g. B-doped Si to serve as the element isolation region is formed inside the third trench 47 by selective epitaxial growth. Subsequently, the oxide film 46 on the inner wall of the second trench 45 is removed by e.g. wet etching and a material layer to serve as the element isolation region is similarly formed inside the second trench 45 by selective epitaxial growth. At last, the oxide film 44 on the inner wall of the first trench 43 is removed by e.g. wet etching and a material layer to serve as the element isolation region is similarly formed inside the first trench 43 by selective epitaxial growth. Thereby, the inside of the first trench 43, the second trench 45, and the third trench 47 is backfilled by the element isolation material layer of e.g. B-doped Si, so that an element isolation region 48 formed of a three-step trench is formed.

The above-described step of removing only the oxide film 46 on the inner wall of the second trench 45 may be carried out based on adjustment of the time of the wet etching. However, the step may be carried out by another method. For example, as the oxide film 44 of the first trench 43, a film having a comparatively-low etch rate, such as a thermally-oxidized film, is formed. Furthermore, on the inner wall of the second trench 45, a film having a comparatively-high etch rate, such as LP-TEOS (Low Pressure Tetraethoxysilane), is formed as the oxide film 46. Combining a film having a low etch rate and a film having a light etch rate in this manner makes it possible to remove the oxide film 46 on the inner wall of the second trench 45 with a certain level of selectivity while leaving the oxide film 44 on the inner wall of the first trench 43.

By using the element isolation region 48 having such a configuration for the solid-state imaging device 30 described above with FIG. 4 to FIG. 6, the solid-state imaging device 30 including the element isolation region 48 formed, with suppression of spread in the lateral direction even in the area close to the light receiving surface can be provided similarly. This can intensify an electric field near the light receiving surface and suppress color crosstalk. Furthermore, the capacitance of the light receiving part formed of e.g. a PD can be increased in the blue region and the amount of saturated signal of the blue band can be increased, so that the dynamic range can be improved.

In addition, also in this case, the element isolation region 48 can be formed by selective epitaxial growth with trisection of the depth of the trench formed finally. Thus, the occurrence of voids can be suppressed.

(3-2) Modification Example with Four-Step Trench Structure

Figure 8:
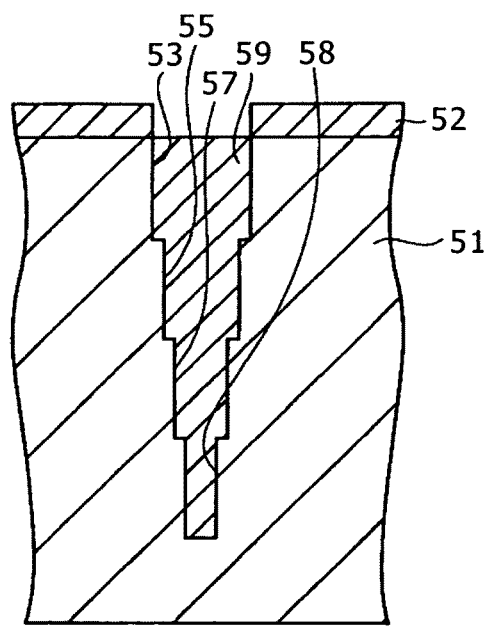
FIG. 8 is a schematic sectional view of the configuration of the major part of a first modification example of the solid-state imaging device according to the embodiment of the present disclosure.

The trench structure may be a four-step structure as shown in FIG. 8 and a five-step or more-step structure can also be employed although not shown in the diagram. In the case of FIG. 8, an oxide film 52 by e.g. thermal oxidation is formed on a substrate 51 and an element isolation region 59 form of four-step trenches 53, 55, 57, and 58 is formed. In the case of forming a four-step or more-step structure in this manner, in the above-described step shown in FIG. 7C, an oxide film is further formed by e.g. thermal oxidation or CVD and a trench having a diameter smaller than that of the lowermost trench is formed under this lowermost trench. At each stage, etching is performed by using the oxide film on the inner wall of the upper layer as a mask. Thereby, in each stacking part, the opening of the lower trench can be so formed as to be smaller than the bottom of the upper trench. By forming the element isolation region based on a trench having such a configuration, a solid-state imaging device including an element isolation region formed with suppression of spread in the lateral direction in a deep area can be obtained similarly to the above-described respective examples.

Also in this case, by applying the element isolation region to the back-illuminated solid-state imaging device 30 shown in FIG. 4, an electric field near the light receiving surface can be intensified and color crosstalk can be suppressed. Furthermore, the capacitance of the light receiving part formed of e.g. a PD can be increased in the blue region and the amount of saturated signal of the blue band can be increased, so that the dynamic range can be improved.

Moreover, also in this case, the occurrence of voids can be suppressed due to forming of the element isolation region 59 by selective epitaxial growth with division of the depth of the trench formed finally into four or more sections.

Figure 9:
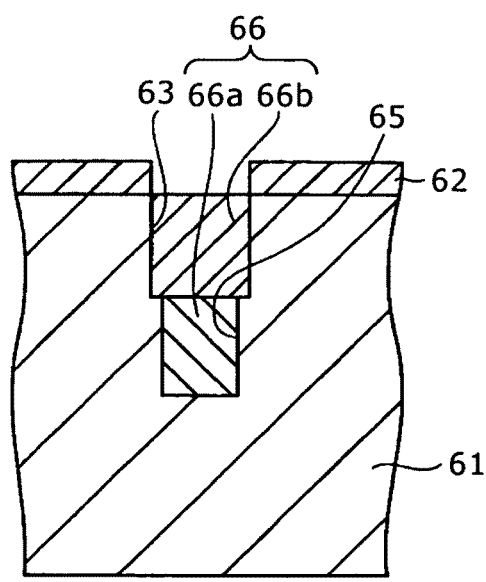
FIG. 9 is a schematic sectional view of the configuration of the major part of a second modification example of the solid-state imaging device according to the embodiment of the present disclosure.

(3-3) Modification Example with Configuration in which Different Material Layers are Stacked in Trench In this example, as shown in FIG. 9, an element isolation region 66 is formed by forming element isolation layers 66a and 66b composed of different materials in a first trench 63 and a second trench 65 by e.g. selective epitaxial growth. In this case, an oxide film 62 is formed on a substrate 61 by e.g. thermal oxidation. Subsequently, the first and second trenches 63 and 65 are formed and the element isolation layers 66a and 66b are formed inside the trenches. As the element isolation layers 66a and 66b, an impurity-containing semiconductor such as B-doped Si is formed by e.g. selective epitaxial growth. Furthermore, in this example, the impurity concentration of the lower element isolation layer 66a is set to comparatively-high concentration and impurity concentration lower than that of the element isolation layer 66a is selected as the impurity concentration of the upper element isolation layer 66b. Depending on the configuration of the solid-state imaging device, the positional relationship between the higher and lower concentration layers may be inverted. If such a configuration is employed, the following advantageous effect is achieved in addition to the advantageous effects when the above-described two-step structure is employed. Specifically, in this case, by selecting low concentration as the concentration of an impurity such as B in a comparatively-shallow area close to the light receiving surface of the substrate 61, parasitic capacitance in the vicinity of the pixel transistor can be reduced. This can suppress the lowering of the conversion efficiency.

Figure 10:
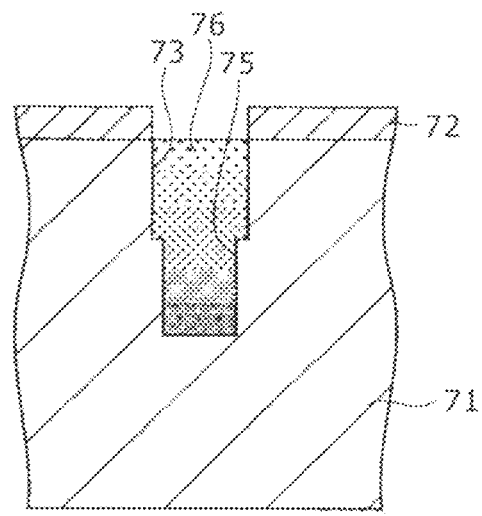
FIG. 10 is a schematic sectional view of the configuration of the major part of a third modification example of the solid-state imaging device according to the embodiment of the present disclosure.

The change in the impurity concentration is not limited to change on a trench-by-trench basis and the concentration can be gradually changed also in a trench of the same diameter. For example, in an example shown in FIG. 10, an oxide film 72 is formed on a substrate 71 and e.g. a two-step structure composed of a first trench 73 and a second trench 75 is formed. Subsequently, an element isolation region 76 composed of e.g. B-doped Si is formed inside these first and second trenches 73 and 75 in such a manner that the impurity concentration is gradually changed. In this case, the element isolation region 76 is formed by performing selective epitaxial growth in such a manner that its impurity concentration is changed in three or more steps or continuously in a non-step manner in the area from the inside of the second trench 75 as the lower trench to the inside of the first trench 73 as the upper trench. In general, the impurity concentration during epitaxial growth can be changed in a stepwise manner and can also be changed gradually and continuously without stop of the epitaxial growth.

Also when such a configuration is employed, parasitic capacitance in the vicinity of the pixel transistor can be reduced by selecting low concentration as the impurity concentration in a shallow area comparatively close to the light receiving surface similarly to the example shown in FIG. 9. This can suppress the lowering of the conversion efficiency.

(4) Another Embodiment of Solid-State Imaging Device (Embodiment of Cis Front-Illuminated Solid-State Imaging Device)

As another embodiment of the solid-state imaging device, an example of application to a CIS solid-state imaging device that is not the back-illuminated type but the normal front-illuminated type will be described below with reference to FIG. 11. A solid-state imaging device 50 shown in FIG. 11 is applied to e.g. the solid-state imaging device 100 having the configuration shown in FIG. 3.

Figure 11:
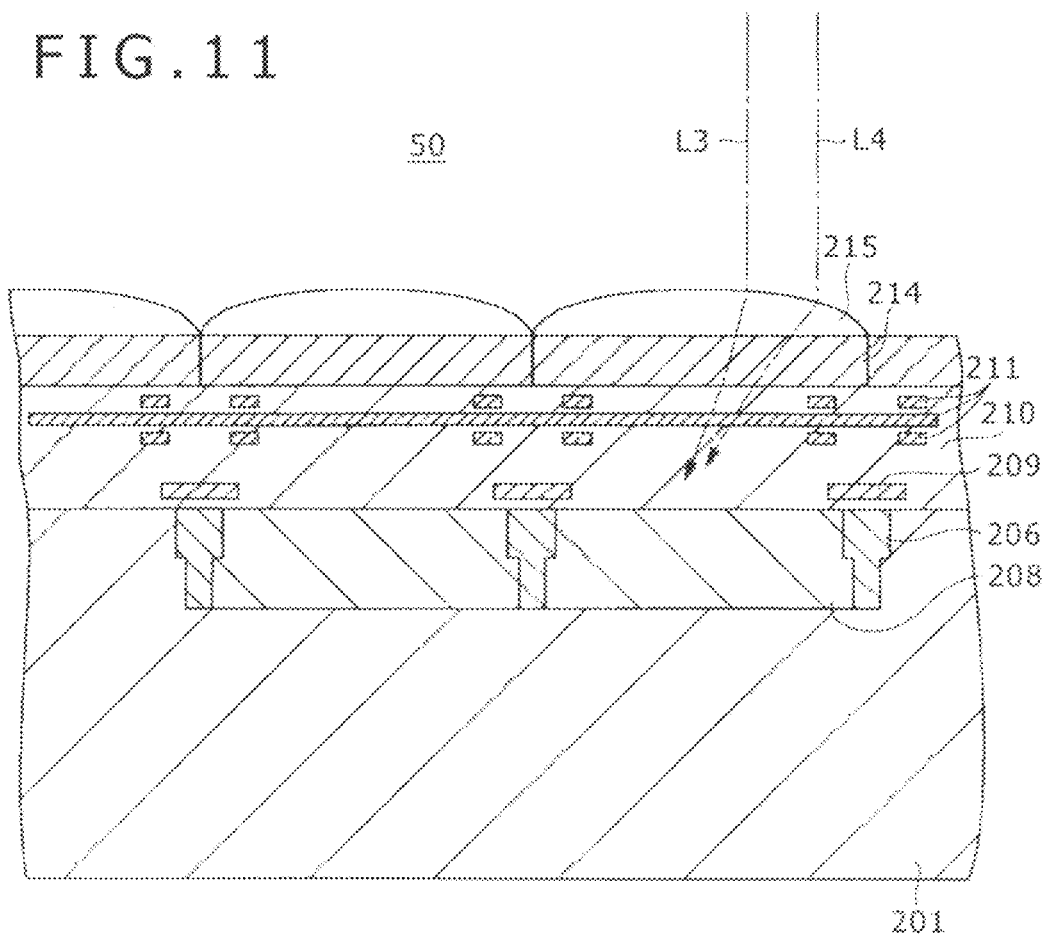
FIG. 11 is a schematic sectional view of the configuration of another example of the solid-state imaging device according to the embodiment of the present disclosure.

In this solid-state imaging device 50, on a substrate 201 composed of e.g. silicon, element isolation regions 206 formed of a multistep trench, i.e. a two-step trench in the example of FIG. 11, having a narrowed width in a deep area are formed. Light receiving parts 208 formed of e.g. a PD to photoelectrically convert incident light are formed in the areas isolated by the element isolation regions 206, and gate electrodes 209 of pixel transistors are formed over the light receiving parts 208 with the intermediary of an insulating layer (not shown). Interconnect layers 211 are formed over the pixel transistors with the intermediary of an insulating layer 210. Over the interconnect layers 211, color filters 214 are formed at the positions corresponding to the light receiving parts 208 with the intermediary of a planarizing layer. On-chip lenses 215 are formed on the color filters 214. One-dot chain lines L3 and L4 in FIG. 11 schematically show how light travels toward the light receiving part 208 through the on-chip lens 215 and the color filter 214. In this example, the element isolation regions 206 for the light receiving parts 208 are each formed of a multistep trench in which two trenches having different diameters are stacked and the diameter of the opening part of the lower trench is smaller than that of the bottom of the upper trench.

According to the front-illuminated solid-state imaging device 50 having such a configuration, the width of the element isolation region 206 in a deep area from the light receiving surface can be narrowed. Thus, the capacitance of the light receiving part 208 formed of e.g. a PD of the red region can be increased for example. Thus, the amount of saturated signal in the red region can be increased and the dynamic range can be improved.

3. Third Embodiment

Embodiment of Electronic Apparatus

The semiconductor device and solid-state imaging devices according to the above-described embodiments of the present disclosure can be applied to various pieces of electronic apparatus having an imaging function, such as camera systems typified by a digital camera and a video camcorder and cellular phones and game machines having an imaging function.

Figure 12:
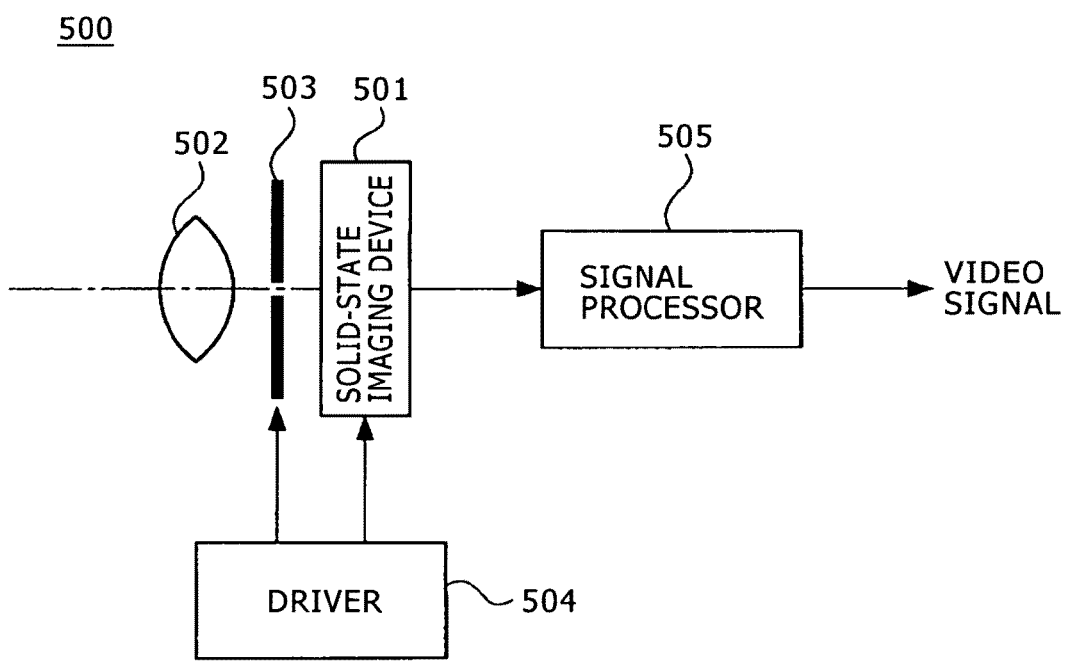
FIG. 12 is a schematic configuration diagram of electronic apparatus according to an embodiment of the present disclosure.

FIG. 12 is a schematic configuration diagram of one example of electronic apparatus according to an embodiment of the present disclosure. Electronic apparatus 500 according to the present embodiment is an example of a video camcorder capable of photographing still image or moving image. This electronic apparatus 500 has a solid-state imaging device 501, a light collecting optical system 502 that guides incident light to the light receiving part of the solid-state imaging device 501, and a shutter device 503. Furthermore, the electronic apparatus 500 has a driver 504 that drives the solid-state imaging device 501 and a signal processor 505 that processes an output signal of the solid-state imaging device 501.

As the solid-state imaging device 501, any of the solid-state imaging devices of the above-described respective embodiments is employed. Furthermore, instead of the solid-state imaging device 501 or in addition to the solid-state imaging device 501, the semiconductor device of the above-described first embodiment may be employed as any semiconductor device included in the driver 504. The optical system (optical lens) 502 forms an image by image light (incident light) from a subject on the imaging plane of the solid-state imaging device 501. Thereby, a signal charge is accumulated in the solid-state imaging device 501 for a certain period. The light collecting optical system 502 may be an optical lens system composed of plural optical lenses. The shutter device 503 controls the period of light illumination to the solid-state imaging device 501 and the period of light blocking. The driver 504 supplies a drive signal to control the transfer operation of the solid-state imaging device 501 and the shutter operation of the shutter device 503. Signal transfer of the solid-state imaging device 501 is carried out by the drive signal (timing signal) supplied from the driver 504. The signal processor 505 executes various kinds of signal processing. The video signal resulting from the signal processing is stored in a storage medium such as a memory or output to a monitor.

In the electronic apparatus such as a camera according to the present embodiment, in the solid-state imaging device 501, the diameter (width in a given section) of the element isolation region can be narrowed and adjusted to a desired diameter with high accuracy. Due to this feature, if this element isolation region is applied to a back-illuminated CIS solid-state imaging device, an electric field near the light receiving surface can be intensified and thus color crosstalk can be suppressed. Furthermore, the capacitance of the light receiving part formed of a PD can be increased particularly in the area near the light receiving surface corresponding to the blue color filter, i.e. in the blue region. This can increase the amount of saturated signal of the blue band and thus can improve the dynamic range.

Conversely, if the above-described element isolation region is applied to a front-illuminated CIS solid-state imaging device, the capacitance of the light receiving part formed of e.g. a PD in a deep area from the light receiving surface can be increased. This can increase the amount of saturated signal of the red band and can improve the dynamic range.

Moreover, due to the inclusion of the solid-state imaging device capable of suppressing color crosstalk from adjacent pixels in this manner, high-quality electronic apparatus allowing high image quality can be provided through achievement of reduction in noise such as color crosstalk and enhancement in the sensitivity.

Furthermore, it is also possible to configure a camera module including the above-described electronic apparatus shown in FIG. 12. This camera module may have a configuration including a lens barrel in which a lens system is incorporated, in addition to the configuration possessed by the above-described electronic apparatus 500 such as a camera. According to the camera module provided with the electronic apparatus including the solid-state imaging device having the above-described configuration, suppression of noise such as color crosstalk in the solid-state imaging device is achieved and enhancement in the sensitivity is achieved. Thus, a high-quality camera allowing high image quality can be configured.

The present disclosure contains subject matter related to that disclosed in Japanese Priority Patent Application JP 2010-164125 filed in the Japan Patent Office on Jul. 21, 2010, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A solid-state imaging device comprising:
   unit pixels arranged two-dimensionally, each of the unit pixels including a light receiving part and at least one transistor to convert a charge obtained by photoelectric conversion in the light receiving part to a signal; and
   an element isolation region configured to isolate the unit pixel and have a trench structure,
   wherein the element isolation region is formed of a multistep trench, the multistep trench including at least two trenches having different diameters stacked in a depth direction of the semiconductor substrate, a diameter of an opening part of a lower trench being smaller than a diameter of a bottom of an upper trench, and
   wherein a plurality of semiconductor layers whose impurity concentrations differ in the depth direction are formed inside the multistep trench.

2. The solid-state imaging device according to claim 1, wherein the multistep trench is formed from a front surface side on which an interconnect connected to the transistor is formed.

3. The solid-state imaging device according to claim 1, wherein light is allowed to be incident from a surface opposite to a surface around which an interconnect connected to the transistor is formed.

4. The solid-state imaging device according to claim 1, wherein the element isolation region is made by forming a semiconductor layer of a conductivity type opposite to a conductivity type of a semiconductor layer configuring the light receiving part in the multistep trench.

5. The solid-state imaging device according to claim 1, wherein the plurality of semiconductor layers whose impurity concentrations differ in the depth direction differ gradually in the depth direction.

6. A solid-state imaging device comprising:
   unit pixels arranged two-dimensionally, each of the unit pixels including a semiconductor device, the semiconductor device including an element isolation region formed on a substrate, the element isolation region including a multistep trench, the multistep trench including at least an upper trench and a lower trench stacked in a depth direction of the substrate, the upper trench and the lower trench having different diameters, and each of the unit pixels further including a light receiving part and at least one transistor to convert a charge obtained by photoelectric conversion in the light receiving part to a signal,
   wherein a plurality of layers are stacked in a depth direction within the multistep trench, and, wherein, within each unit pixel, the element isolation region of the semiconductor device is configured to isolate the unit pixel, and wherein the multistep trench is formed from a front surface side on which an interconnect is connected to the transistor.

7. A solid-state imaging device comprising:

unit pixels arranged two-dimensionally, each of the unit pixels including a semiconductor device, the semiconductor device including an element isolation region formed on a substrate, the element isolation region including a multistep trench, the multistep trench including at least an upper trench and a lower trench stacked in a depth direction of the substrate, the upper trench and the lower trench having different diameters, and each of the unit pixels further including a light receiving part and at least one transistor to convert a charge obtained by photoelectric conversion in the light receiving part to a signal, wherein a plurality of layers are stacked in a depth direction within the multistep trench, and, wherein, within each unit pixel, the element isolation region of the semiconductor device is configured to isolate the unit pixel, and wherein the solid-state imaging device light is configured to allow light to be incident from a surface opposite to a surface around which an interconnect connected to the transistor is formed.

8. A solid-state imaging device comprising:

unit pixels arranged two-dimensionally, each of the unit pixels including a semiconductor device, the semiconductor device including an element isolation region formed on a substrate, the element isolation region including a multistep trench, the multistep trench including at least an upper trench and a lower trench stacked in a depth direction of the substrate, the upper trench and the lower trench having different diameters, and each of the unit pixels further including a light receiving part and at least one transistor to convert a charge obtained by photoelectric conversion in the light receiving part to a signal, wherein a plurality of layers are stacked in a depth direction within the multistep trench, and, wherein, within each unit pixel, the element isolation region of the semiconductor device is configured to isolate the unit pixel, and wherein the plurality of layers stacked in the depth direction within the multistep trench includes a semiconductor layer of a conductivity type opposite to a conductivity type of a portion of the light receiving part.

* * * * *